United States Patent
Morifuji

[11] Patent Number: 5,990,504
[45] Date of Patent: Nov. 23, 1999

[54] FINGER STRUCTURED MOSFET

[75] Inventor: Eiji Morifuji, Yokohama, Japan

[73] Assignee: Kabushiki Kaisha Toshiba, Kawasaki, Japan

[21] Appl. No.: 09/313,281

[22] Filed: May 18, 1999

[51] Int. Cl.[6] .................................................. H01L 29/78
[52] U.S. Cl. .................... 257/270; 257/341; 257/270; 257/287
[58] Field of Search ................... 257/287, 341, 257/270, 365, 366; 438/279, 284

[56] References Cited

U.S. PATENT DOCUMENTS

| | | | |
|---|---|---|---|
| 3,967,988 | 7/1976 | Davidsohn | 257/401 |
| 4,725,747 | 2/1988 | Stein et al. | 257/296 |
| 4,771,195 | 9/1988 | Stein | 257/342 |
| 4,808,861 | 2/1989 | Ehni | 257/342 |
| 4,949,139 | 8/1990 | Korsh et al. | 257/296 |
| 5,404,041 | 4/1995 | Diaz et al. | 257/360 |
| 5,528,065 | 6/1996 | Battersby et al. | 257/365 |
| 5,563,439 | 10/1996 | Chung et al. | 257/365 |
| 5,623,387 | 4/1997 | Li et al. | 257/355 |
| 5,731,614 | 3/1998 | Ham | 257/355 |
| 5,789,791 | 8/1998 | Bergemont | 257/401 |
| 5,828,102 | 10/1998 | Bergemont | 257/342 |
| 5,874,763 | 2/1999 | Ham | 257/355 |

*Primary Examiner*—David B. Hardy
*Attorney, Agent, or Firm*—Banner & Witcoff, Ltd.

[57] ABSTRACT

A boundary of a well 102 of a finger structured MOSFET is positioned between an element region 104 and a gate contact 108. With this geometry, it is feasible to reduce the well and attain a decrease in noises. A well electric potential take-out region 105 is disposed in close proximity to the element region 104 within the well 102, thereby making it possible to reduce an areal size of the well and farther decrease the noises.

7 Claims, 8 Drawing Sheets

D-D SECTION

FINGER STRUCTURED MOSFET

BACKGROUND OF THE INVENTION

The present invention relates to a finger structured MOSFET, and more particularly to a MOSFET suitable for an application of reducing noises.

It is highly requested of an analog system circuit required to have a low noise characteristic that high-frequency noises of a transistor used for the analog circuit be decreased.

The noises emitted from the transistor are mainly caused by a resistance component. That is, the resistance component, when an electric current flows therethrough, emits heat noises, thus becoming a noise source.

Generally, the transistor used in a high-frequency analog amplifier circuit has a large size for reducing an input impedance and ensuring a gain. In this case, however, a gate resistance increases, and on the contrary the noise characteristic declines.

Such being the case, a comb-shaped transistor is proposed as a MOSFET exhibiting the low noise characteristic.

FIG. 13 is a plan view illustrating a construction of a finger structured MOSFET which has hitherto been proposed. FIG. 14 is a sectional view thereof taken along the line D-D. An active region 4 taking a laterally elongate rectangular shape serving as a source or drain region, which is surrounded with an element isolation layer 3, is provided within a well 2 formed in the surface of a semiconductor substrate 1. A polysilicon layer 6 serving as a gate electrode is provided on the element isolation layer 3 and the active region 4 as well, and a geometry thereof is, as shown in FIG. 13, that a plurality of gates each taking a rectangular shape with a predetermined width (a gate length) and connected to each other to form a gate electrode, reciprocates up and down with respect to the active region 4 on the element isolation layer 3 as viewed in FIG. 13 while traversing the active region 4, thus assuming rectangular undulations (a finger structure). Then, an impurity is diffused into the active regions 4 disposed on both sides of the gates defined as transverse areas, whereby sources 4a and drains 4b are alternately formed in self-alignment to the gates.

With such a geometry being adopted, an apparent gate width of the transistor is increased while restraining a gate resistance.

Further, a substrate contact region 5 for taking out an electric potential of the well, is provided outwardly at a spacing from the active region 4.

Moreover, a first contact hole 8 for supplying the gate electrode with an electric signal and a second contact hole 9 for taking out the well electric potential, are formed penetrating a first inter-layer insulating layer 7 deposited on the semiconductor substrate 1, and are filled with a metal such as aluminum etc, thus forming a first layer wire 10 through patterning. Herein, the first contact hole 8 is positioned between the active region 4 and the well electric potential take-out region 5.

A second inter-layer insulating layer 11 deposited on the first inter-layer insulating layer 7 is formed with a third contact hole 12 corresponding to the first contact hole 8, and a second layer wire (a gate wire) 13 is formed on the second inter-layer insulating layer 11, which involves filling the hole 12 with a metal and undergoing the patterning. Note that refractory metal silicide is provided on the surfaces of the gate electrode and of the gate wire, whereby a much lower resistance thereof can be attained.

Herein, as illustrated in FIG. 14, a variety of parasitic capacitances and parasitic resistances might occur in the construction of the finger structured MOSFET in FIG. 13. For instance, it might be considered that there exist a capacitance Cgb between the gate polysilicon layer and the well, a substrate resistance R between the well and the well electric potential take-out substrate contact, and a capacitance Cpad between the gate wire and the substrate.

On the other hand, the high frequency noises are influenced by a distance between the substrate contact and the element region and by a size of the well.

FIG. 11 is a graph showing a relationship between a drain current and a noise factor NF when an operation frequency is 2 GHz, wherein what is marked with a black circle shows a characteristic in a conventional MOSFET of which a gate width is 200 $\mu$m and a gate length is 0.25 $\mu$m.

In the conventional finger structured MOSFET, the substrate contact is formed outwardly of the contacts of the active region and of the gate electrode, and hence a distance between the substrate contact and an impurity diffused region could not be sufficiently decreased. There was therefore a limit in reducing the noises.

SUMMARY OF THE INVENTION

It is a primary object of the present invention to provide, in a low noise MOSFET having a finger structure, a finger structured MOSFET capable of reducing the noises by optimizing structures of a well and of a well electric potential take-out area.

According to one aspect of the present invention, there is provided a finger structured MOSFET comprising:

a well having a first conductivity type, provided on a surface of a semiconductor substrate;

a gate electrode constructed by connecting a plurality of gates each traversing said well;

a plurality of active regions having a second conductivity type, provided on both sides of each of said plurality of gates within said well;

an insulating layer covering the whole;

a contact hole formed in said insulating layer and connected to said gate electrode; and a wiring material filling said contact hole, wherein a boundary of said well exists in a position between said active region and said contact hole.

According to the present invention, a boundary of the well exists between an active region and a position of a gate contact, whereby it is feasible to reduce a size of the well and restrain an emission of noises by decreasing a capacitance between the gate and a substrate.

Furthermore, the active region and a well electric potential take-out region are provided at a spacing from or adjacently to an element isolation region within this reduced well, whereby the active region and the well electric potential take-out region can be disposed in close proximity to each other, a noise characteristic can be enhanced by farther reducing the areal size of the well, and in addition an areal size of a chip can be reduced.

Moreover, a contact hole for taking out a well electric potential is formed so as to be contiguous to both of the well electric potential take-out region and the active region adjacent thereto, or all of the well electric potential take-out region and the active regions disposed on both sides of the well electric potential take-out region, whereby the areal size of the well can be reduced and the noises can be farther decreased by reducing a parasitic capacitance.

Further, a first well electric potential take-out region is formed adjacently to the active region, a second well electric potential take-out region is provided outwardly of the active region within the well, and the contact hole for taking out the well electric potential is formed in the second well electric potential take-out region, thereby making it possible to stabilize, with the electric potential of the active region being given from the well, an operation of a transistor while the well electric potential is fetched out of the same contact.

Furthermore, a refractory metal silicide layer is provided on the surfaces of the well electric potential take-out region and of the active region, whereby the noises can be farther reduced by decreasing a resistance of each of the regions.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Some embodiments of a finger structured MOSFET according to the present invention will hereinafter be described with reference to the accompanying drawings.

Figure 1:
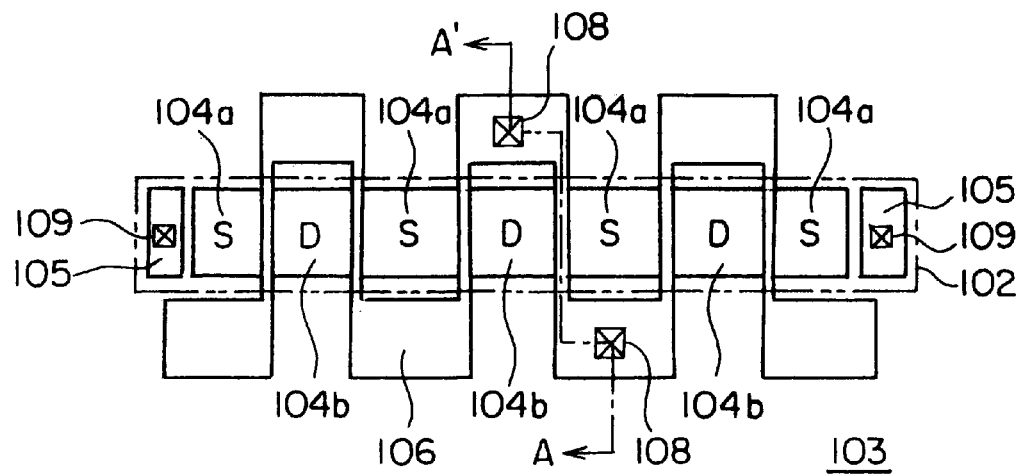
FIG. 1 is a plan view showing a plane structure of a comb-like MOSFET in a first embodiment of the present invention.
Figure 2:
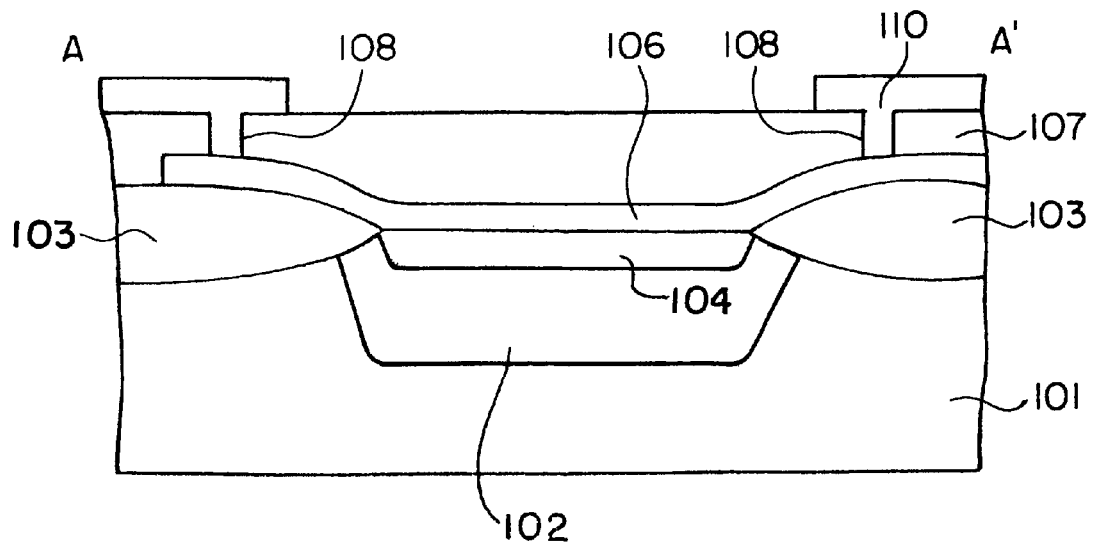
FIG. 2 is a sectional view taken along the line A–A' in FIG. 1.

FIG. 1 is a top view showing a first embodiment of the finger structured MOSFET of the present invention. FIG. 2 is a sectional view taken along the cut line A–A' shown in FIG. 1.

Figure 13:
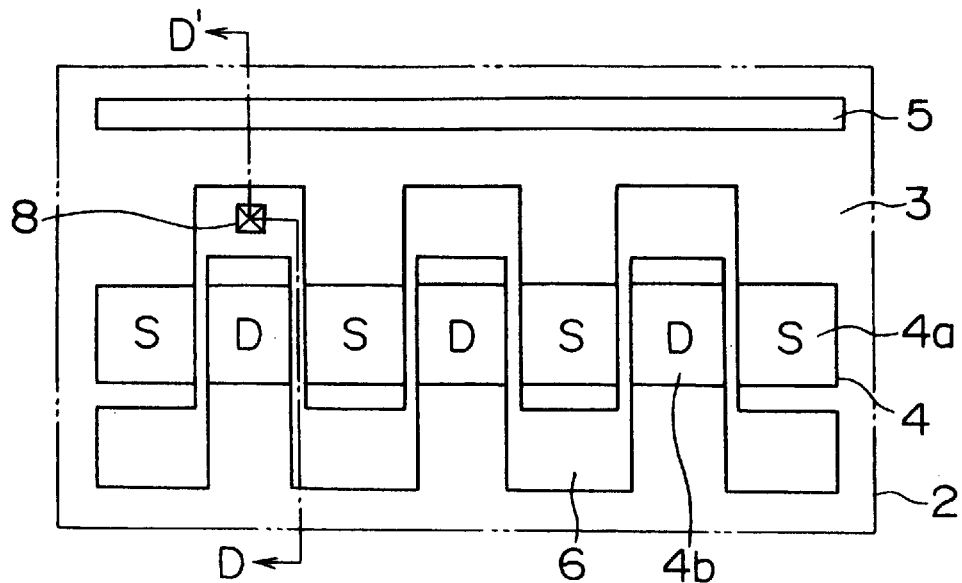
FIG. 13 is a plan view showing a construction of a finger structured MOSFET which has hitherto been proposed.

Referring to FIGS. 1 and 2, a well 102 taking a laterally-elongate rectangular shape is formed in a region including an active region. The field oxide layer 103 for isolating an element, which is provided on a surface of a semiconductor substrate 101. A gate electrode 106 assuming the same configuration as that shown in FIG. 13 is provided passing on the active region 104 between the both side of field oxide layer 103. Then, sources 104a and drains 104b are alternately provided on both sides of the gate.

The followings are remarkable differences from the configuration in FIG. 13. A first difference is that a boundary made by long sides (in a gate-lengthwise direction) of the well 102 exists between an active region 104 of the source 104a and the drain 104b, and a contact hole 108 of the gate electrode. A second difference is that a region 105 for taking out a well electric potential is provided in close proximity to the active region within the well 102. Besides, the well electric potential take-out regions 105 are provided only in positions adjacent to the sources at both terminals of a transistor. The region 105 is isolated from the source 104a by the field oxide layer. A contact hole 109 for taking-out the well electric potential is formed in the region 105.

Further, as illustrated in FIG. 2, the gate electrode 106 is connected to a wire 110 via the contact hole 108 formed in an inter-layer insulating film 107 deposited on the field oxide layer 103 and the active region 104.

Figure 14:
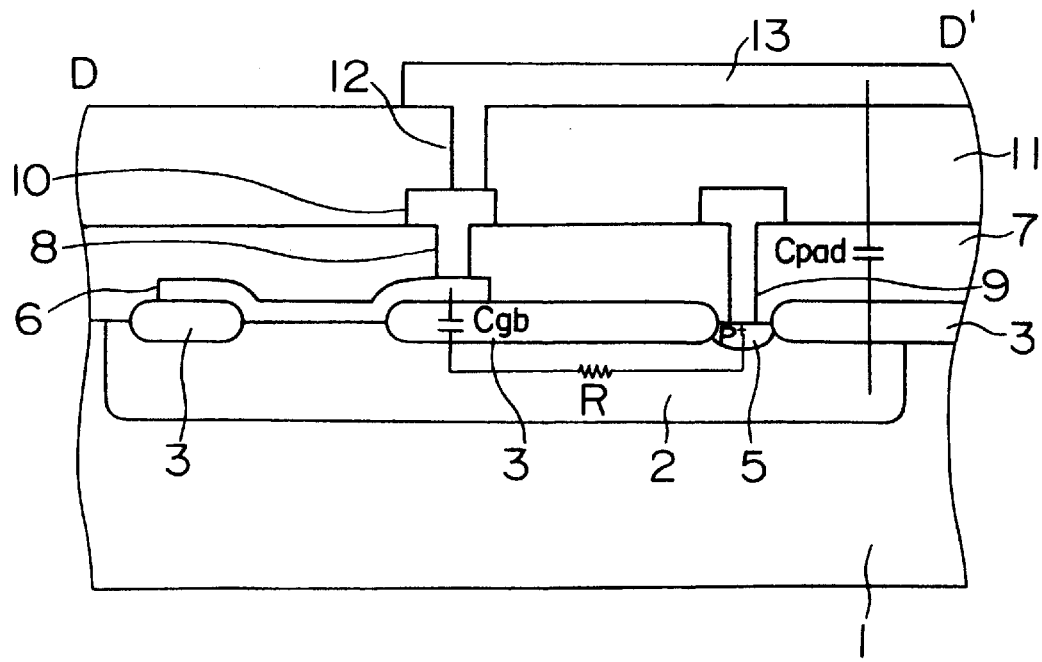
FIG. 14 is a sectional view taken along the line D-D' in FIG. 13.

When the well boundary exists in the position between the active region and the gate contact hole, and the well electric potential take out region is close proximity to the drain region within the same well, the capacitance between substrate and the gate electrode is reduced due to the reduction of the overlapping gate electrode with capacitance Cgb and substrate resistance R as shown in FIG. 14, the MOSFET regarding the first embodiment shows lower noise characteristic on the benefit of reduction of Cgb.

Figure 3:
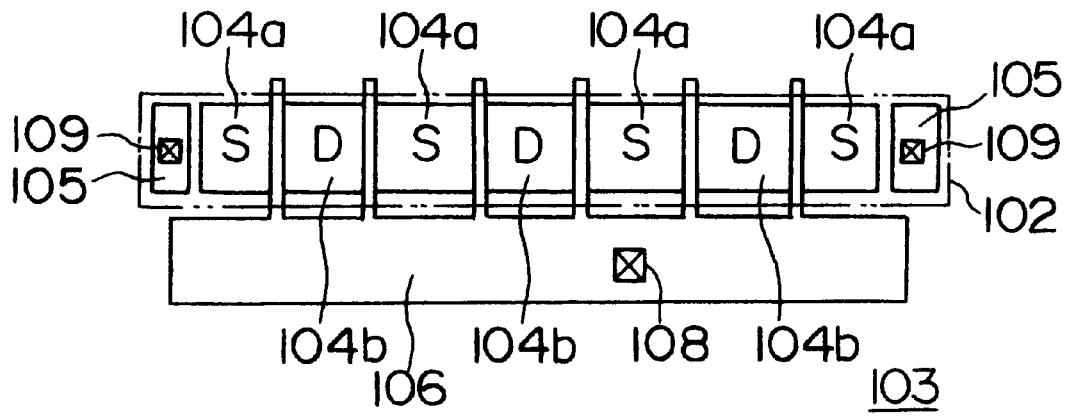
FIG. 3 is a plan view showing another configurational example of gates traversing a well.
Figure 4:
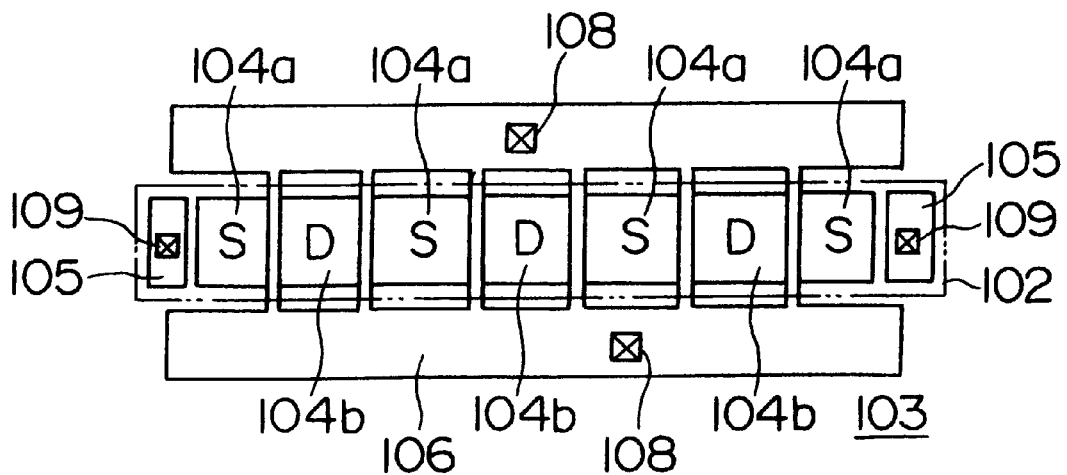
FIG. 4 is a plan view showing still another configurational example of the gates traversing the well.
Figure 5:
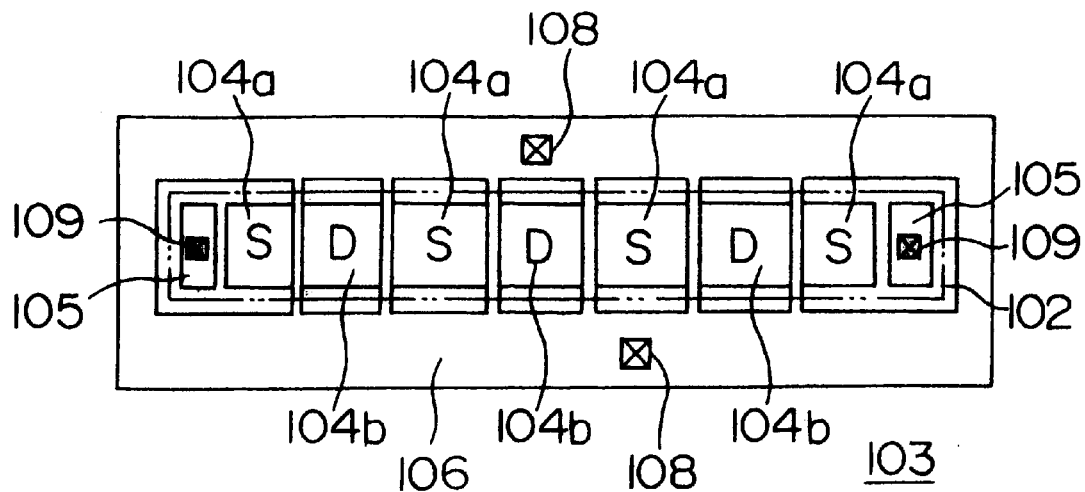
FIG. 5 is a plan view showing a further configurational example of the gates traversing the well.

In the case of FIG. 1, the gates traversing the well 102 are alternately connected in up-and-down positions in FIG. 1. However, as illustrated in FIGS. 3–5, it is possible to adopt such a configuration that the gates are connected only one side (FIG. 3), or on both sides (FIG. 4), or surrounded by the gate electrode (FIG. 5). This variation on the configuration of gate electrode can be adopted to the following embodiments which follow.

Next, a method of manufacturing the finger structured MOSFET described above is explained.

To start with, ions are implanted into a semiconductor substrate 101 to form a well in a predetermined region, and a thermal treatment for a well diffusion is done, thereby formed the well 102. Subsequently, the field oxide layer 103 for isolating the element is provided on the surface of the semiconductor substrate by a selective oxidation method, and so on.

Thermal oxide layer is formed by a surface thermal oxidation, and polysilicon is sequentially deposited to form gate electrode. These layers are patterned as a predetermined configuration by dry etching, thereby providing a gate insulating layer and the gate electrode 106.

Next, ions of opposite conductivity type to the well are implanted with a high concentration. To be more specific, in the case of p-well, phosphorus and arsenic ions, etc. are implanted to form an $n^+$ diffused layer in self-alignment to the gate electrode 106, and, in the case of n-well, boron etc is implanted to form a $p^+$ diffused layer in self-alignment to the gate electrode 106. These diffused layers turn out to be the source region 104a and the drain region 104b.

Successively, there is formed the region 105 for taking out the well electric potential at the outermost end within the well. The ions having the opposite conductivity type to the transistor, i.e., the same conductivity type as that of the well are implanted. Namely, boron etc is implanted in the case of the p-well, and phosphorus and arsenic etc. are implanted in the case of the n-well. Incidentally, this ion implantation can be done simultaneously with an ion implantation regarding to the source and the drain of the transistor having the opposite conductivity type.

Thereafter, a silicide layer is formed on the source 104a, the drain 104b, the well electrical potential take-out region 105 and the gate electrode 106 by a SALICIDE process if it is required. Silicide used here can be, e.g., $TiSi_2$, $CoSi_2$, NiSi and $PtSi_2$. It is to be noted that the structure according to the present invention is suited to the SALICIDE process.

Figure 6:
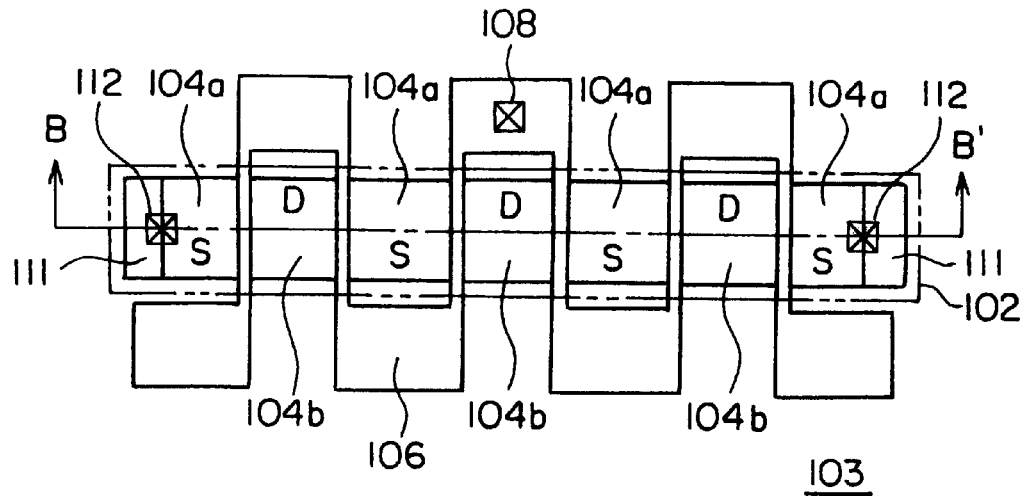
FIG. 6 is a plan view showing a plane structure of the comb-like MOSFET in a second embodiment of the present invention.
Figure 7:
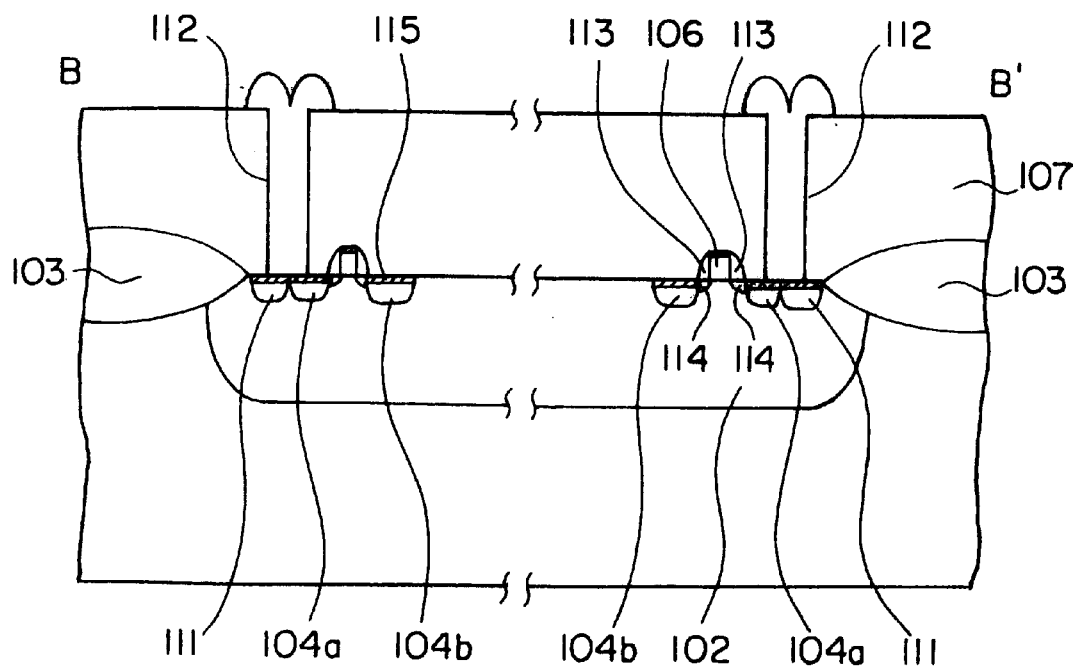
FIG. 7 is a sectional view taken along the line B–B' in FIG. 6.

Thereafter, the contact hole 108 for gate wiring and so on is formed in a position shown in FIG. 1 after forming the inter-layer insulting film 107, then a metal such as aluminum etc is deposited thereon, and this is patterned, thereby forming a metal wire. FIG. 6 is a top view showing a second embodiment of the finger structured MOSFET according to the present invention. FIG. 7 is a cross sectional view along the line B–B'. Referring to FIG. 7, however, a reciprocative portion in the middle of the gate electrode is omitted.

The second embodiment is similar to the first embodiment shown in FIG. 1. A different point is that well electric potential take-out regions 111 are put, adjacent to the source regions 104a formed at the outermost ends within the well 102 without field isolation, and contact holes 112 are formed so as to extract to both regions at the same time. This positional relationship is obvious from the sectional view of FIG. 7. By providing the contact area in common to the source region 104a and the well electric potential take-out region 111, the electric potentials of the well and the source are equalized. With this configuration, it is feasible to reduce to the parasitic capacitance between well and substrate that results in the noise degradation by reducing the area of well.

It is to be noted that FIG. 7 shows so-called LDD structure which has insulating layer spacers 113 on both sides of the gate electrode 106, and a low-concentration shallow impurity diffused layer 114 formed under the spacer 113. Further, a silicide layer 115 is formed on the source/drain regions 104a, 104b, the well electric potential take-out region 111 and the gate electrode 106. In particular, the source region 104a and the well electric potential take-out region 111 are equalized in terms of their electric potentials.

Figure 8:
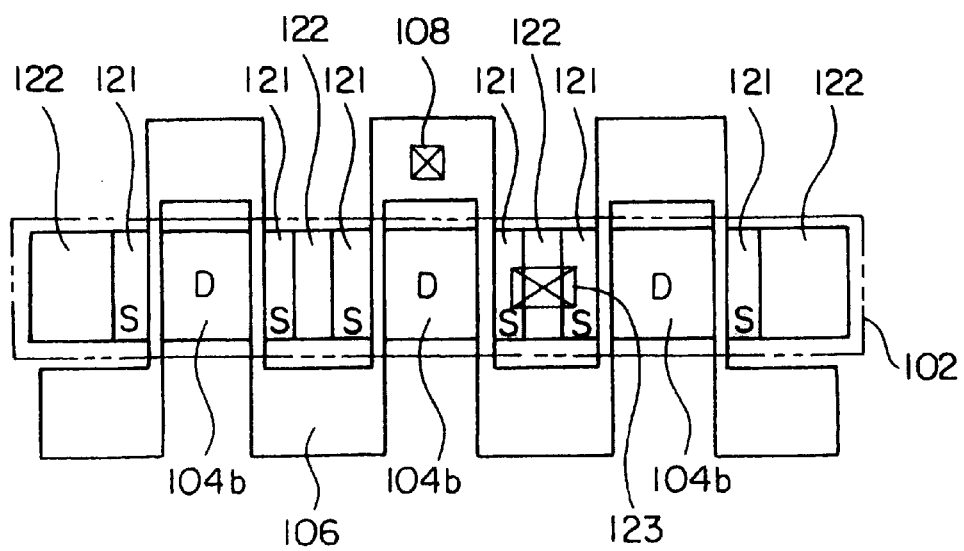
FIG. 8 is a plan view showing a plane structure of the comb-like MOSFET in a third embodiment of the present invention.

FIG. 8 is a top view showing a construction of a third embodiment of the finger structured MOSFET of the present invention, wherein the well contact is provided in the middle of each source diffused layer. The ions of the opposite conductivity type to the source region are implanted into the central area of active region for source. That is, in the case of PMOS, the phosphorus is implanted to the central area of $p^+$ As region 121. This central region works as the substrate contact to extract the electrical potential of well. A contact hole 123 for this area is put as contacting both regions at the same time by extending over these two regions.

By adopting such a configuration, the parasitic capacitance can be significantly decreased by reducing the well area equivalently, and, even if the resistivity of well is high in the thermal noise viewpoint, the degradation of noise characteristics on MOSFET is reduced by decreasing the gate bulk capacitance and well capacitance.

Figure 9:
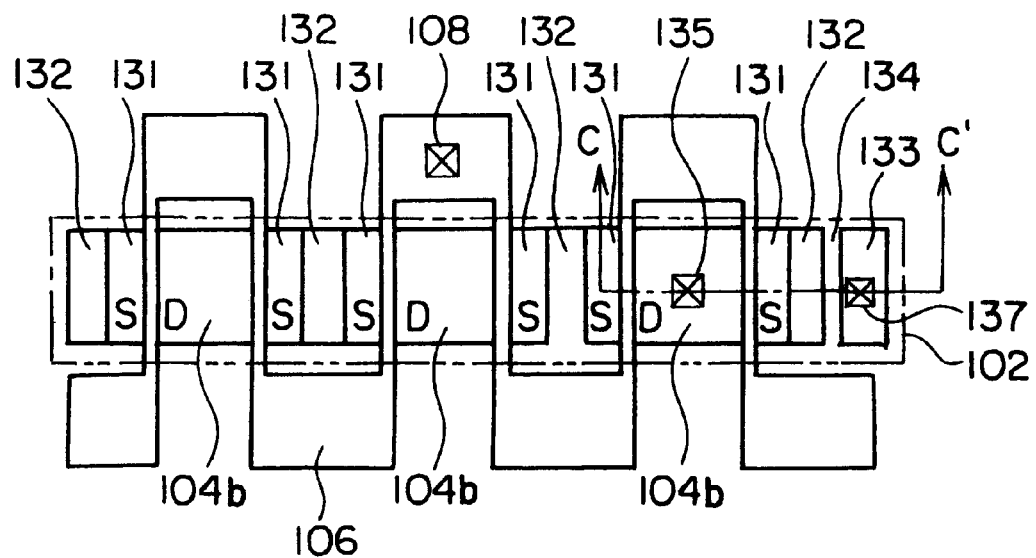
FIG. 9 is a plan view showing a plane structure of the comb-like MOSFET in a fourth embodiment of the present invention.
Figure 10:
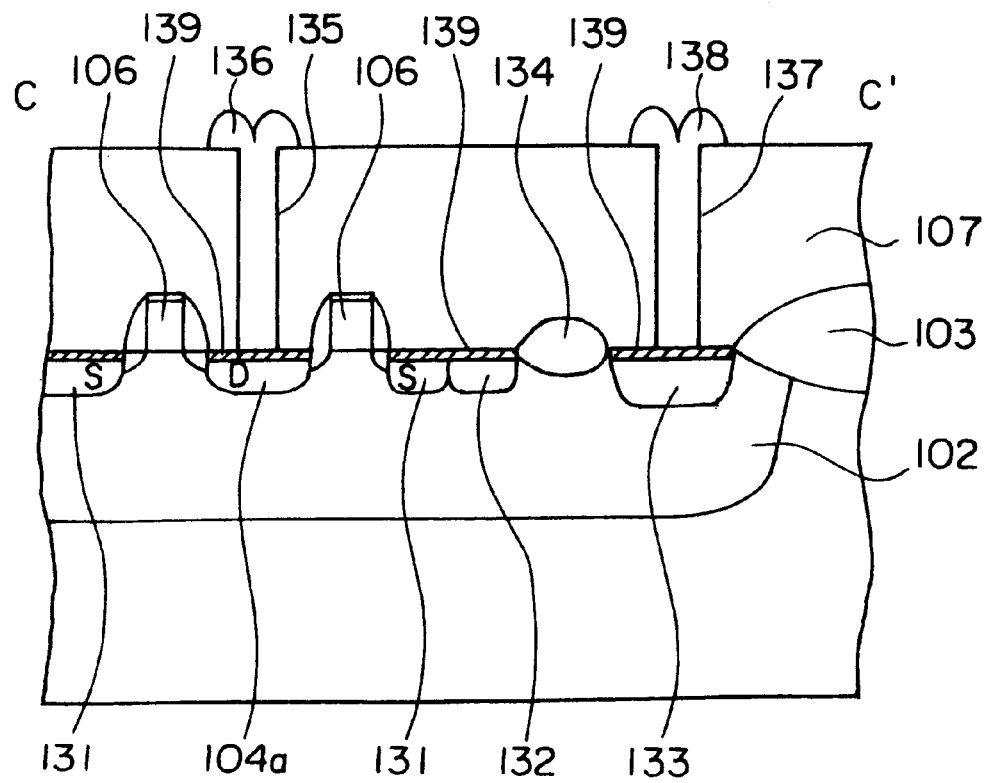
FIG. 10 is a sectional view taken along the line C–C' in FIG. 9.

FIG. 9 is a top view showing a construction of a fourth embodiment of the finger structured MOSFET of the present invention. FIG. 10 is a partial sectional view across the line C–C' in FIG. 9.

The fourth embodiment has, as in the third embodiment, such a construction that a high concentration region with the same type with well 132 is formed between neighboring source regions 131, and substrate contact region 133 is put adjacently to a source region 131 at the outermost end. A silicide layer 139 is formed over the surfaces of the drain region 104b, the well contact regions 132, 133, the source region 131 and the well contact region 132 are connected each other by silicide and are equalized in terms of their electric potentials.

Further, as shown in FIG. 10, contact holes 135, 137 are formed through the inter-layer insulating layer 107, corresponding to the drain region 104b and the well electric potential take-out region 133, and then filled with metals, thus forming wires 136, 138.

In the fourth embodiment, the are of well is reduced by decreasing the contacts within the active region, and the influence of the resistance component can be reduced by decreasing the parasitic capacitance even when the resistivity of the substrate is high.

Figure 11:
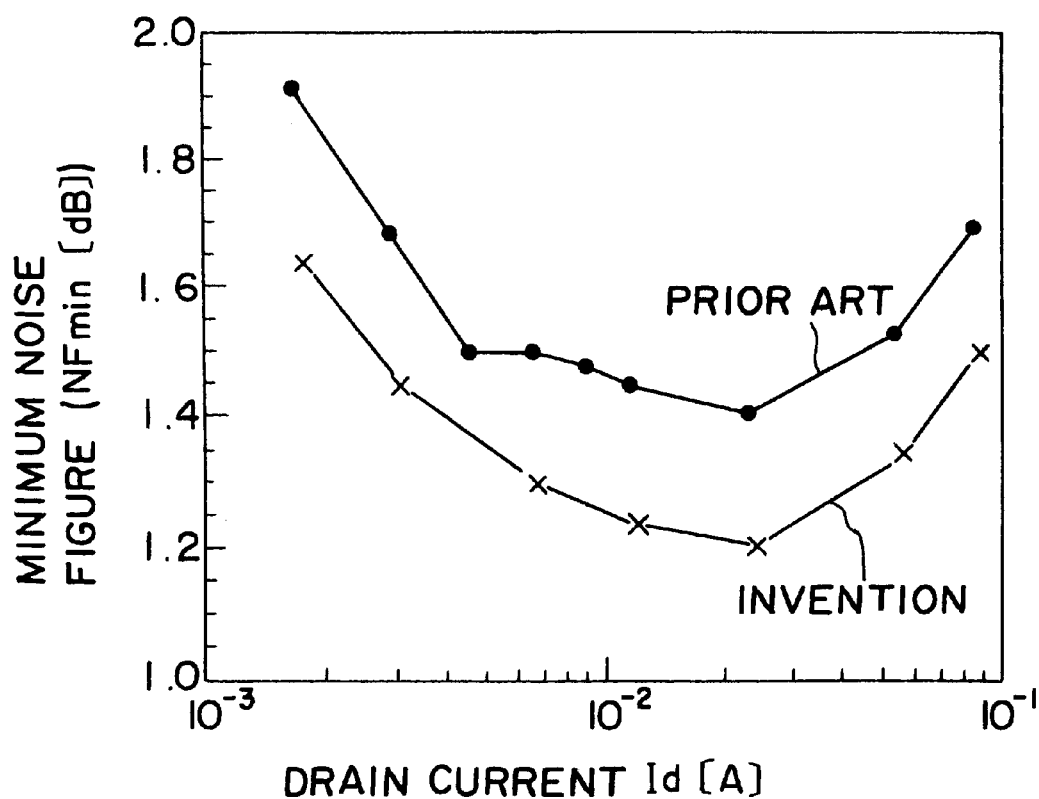
FIG. 11 is an explanatory graph showing an enhancement of a high frequency noise characteristic when the present invention is applied.

FIG. 11 shows an effect of reducing the high frequency noise according to the present invention. Mark X represents a characteristic regarding the present invention in which a size of the well including the element is reduced, and a position of the well contact is made proximal to the element region. It can be understood from this graph that the high frequency noise becomes smaller with the well areal size being reduced by making the well contact position proximal to the element region than in the prior art device described above.

Figure 12:
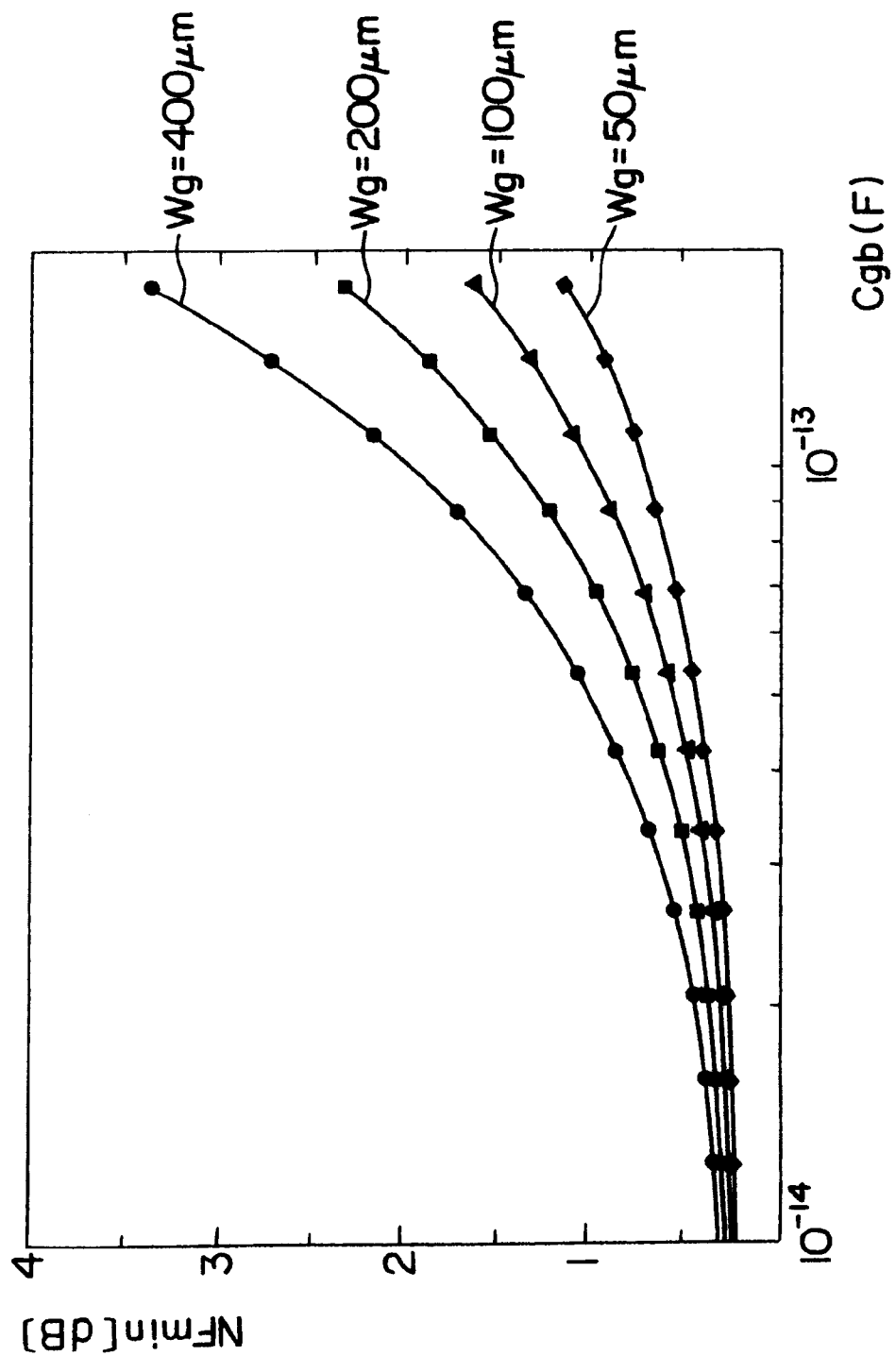
FIG. 12 is an explanatory graph showing an effect of reducing high frequency noises by reducing a size of the well according to the present invention.

FIG. 12 is a graph shows the gate width dependence of noise figure (NF) on a capacitance Cgb which exists between the gate silicon layer and the well.

According to the present invention, it can be comprehended from FIG. 12 that the noise figure is decreased in any gate widths owing to a decrease in the capacitance Cgb by reducing the well.

Because the thermal noise caused by substrate resistance R flows into the input of MOSFET through the capacitance Cgb shown in FIG. 14, the noise figure characteristic improves by reducing the Cgb. Reducing the well capacitance that is achieved by reducing the area of well can reduce Cgb. This explains the effect of fifth embodiment.

Note that the conductivity types of the well and the transistor in the embodiments discussed above can be properly reversed in the present invention. Further, the number and the positions of the contacts may be freely selected excluding a special case. Moreover, the present invention may be applied to a so-called MISFET in which the gate insulating layer is composed of a nitride layer etc. other than the oxide layer, and can be properly carried out by way of modifications thereof within the scope of the present invention without deviating from the gist of the invention.

What is claimed is:

1. A finger structured MOSFET comprising:
   a well having a first conductivity type, provided on a surface of a semiconductor substrate;
   a gate electrode constructed by connecting a plurality of gates each traversing said well;
   a plurality of active regions having a second conductivity type, provided on both sides of each of said plurality of gates within said well;
   an insulating layer covering the whole;
   a contact hole formed in said insulating layer and connected to said gate electrode; and
   a wiring material filling said contact hole,
   wherein a boundary of said well exists in a position between said active region and said contact hole.

2. A finger structured MOSFET according to claim 1, wherein a well electric potential take-out region is so provided as to be spaced away from said active region and an element isolating region.

3. A finger structured MOSFET according to claim 1, wherein a well electric potential take-out region is so provided as to be adjacent to said active region.

4. A finger structured MOSFET according to claim 3, wherein said well electric potential take-out region is so provided as to exist within said active region.

5. A finger structured MOSFET according to claim 3, wherein a contact hole of take-out an well electric potential is so formed as to be contiguous to both of said well electric potential take-out region and said active region adjacent thereto.

6. A finger structured MOSFET according to claim 1, wherein a first well electric potential take-out region is put adjacently to said active region, a second well electric potential take-out region is provided outwardly of said active region within said well, and a contact hole for taking out the well electric potential is formed in said second well electric potential take-out region.

7. A finger structured MOSFET according to claim 2, wherein a silicide layer is provided on surfaces of said well electric take-out region and of said active region.

* * * * *